(12) United States Patent
Chapman

(10) Patent No.: US 11,271,522 B2
(45) Date of Patent: Mar. 8, 2022

(54) HUMIDITY-CONTROLLED ELECTRONIC COMPONENT ASSEMBLIES FOR PHOTOVOLTAIC SYSTEMS

(71) Applicant: Enphase Energy, Inc., Petaluma, CA (US)

(72) Inventor: Patrick L. Chapman, Austin, TX (US)

(73) Assignee: Enphase Energy, Inc., Petaluma, CA (US)

( * ) Notice: Subject to any disclaimer, the term of this patent is extended or adjusted under 35 U.S.C. 154(b) by 1088 days.

(21) Appl. No.: 15/335,060

(22) Filed: Oct. 26, 2016

(65) Prior Publication Data
US 2018/0115277 A1    Apr. 26, 2018

(51) Int. Cl.
*H02S 40/32*   (2014.01)
*H02S 40/40*   (2014.01)
(Continued)

(52) U.S. Cl.
CPC .......... *H02S 40/32* (2014.12); *H01L 31/049* (2014.12); *H02J 3/383* (2013.01); *H02S 30/10* (2014.12);
(Continued)

(58) Field of Classification Search
CPC ................................. H02S 40/32; H02J 3/383
See application file for complete search history.

(56) References Cited

U.S. PATENT DOCUMENTS

| | | |
|---|---|---|
| 4,816,748 A | 3/1989 | Tazawa |
| 6,128,193 A | 10/2000 | Moss |

(Continued)

FOREIGN PATENT DOCUMENTS

| | | |
|---|---|---|
| CN | 102356475 A | 2/2012 |
| CN | 102625491 A | 8/2012 |

(Continued)

OTHER PUBLICATIONS

Ilja Belov et al. "CFD Assisted Design Evaluation and Experimental Verification of a Logic Controlled Local PCB Heater for Humidity Management in Electronics Enclosure" 11th Int. Conf. on Thermal, Mechanical and Multiphysical Simulation and Experimetns in Microelectronics and Micro-Systems, EuroSimE 2010.

(Continued)

*Primary Examiner* — Niki Bakhtiari
(74) *Attorney, Agent, or Firm* — Moser Taboada

(57) ABSTRACT

Photovoltaic (PV) assemblies and modules for converting solar radiation to electrical energy are disclosed. A PV module comprises a plurality of PV or solar cells for generating DC power. In some embodiments, the plurality of solar cells are encapsulated within a PV laminate. A PV assembly comprises an electronic component assembly coupled to the PV module. The electronic component assembly comprises an enclosure defining an interior region and a power conditioning circuit within the interior region of the enclosure. The power conditioning circuit comprises at least one electronic component for conditioning power generated by the plurality of solar cells. The electronic component assembly comprises a first electrical conduit for inputting direct current (DC) generated by the plurality of solar cells to the power conditioning circuit. The electronic component assembly further comprises a second electrical conduit for outputting conditioned power from the power conditioning circuit. Additionally, the electronic component assembly comprises a humidity control circuit within the enclosure for performing a dehumidification operation. The humidity control circuit comprises a first heating component and regulates a moisture or humidity level within the interior region of the enclosure.

20 Claims, 8 Drawing Sheets

(51) Int. Cl.
  *H02S 40/00* (2014.01)
  *H02S 40/10* (2014.01)
  *H01L 31/049* (2014.01)
  *H02S 30/10* (2014.01)
  *H02J 3/38* (2006.01)

(52) U.S. Cl.
  CPC .............. *H02S 40/00* (2013.01); *H02S 40/10* (2014.12); *H02S 40/40* (2014.12); *Y02E 10/50* (2013.01)

(56) References Cited

U.S. PATENT DOCUMENTS

| | | | |
|---|---|---|---|
| 2009/0038668 A1 | 2/2009 | Plaisted | |
| 2009/0084426 A1* | 4/2009 | Fornage | H01L 31/052 136/244 |
| 2010/0206378 A1* | 8/2010 | Erickson, Jr | H01L 31/02021 136/259 |
| 2012/0127770 A1* | 5/2012 | Kim | H05K 7/209 363/141 |
| 2012/0192921 A1* | 8/2012 | Tiittanen | H01L 31/02021 136/248 |
| 2014/0166635 A1* | 6/2014 | Andrae | H02J 3/383 219/209 |
| 2014/0260001 A1* | 9/2014 | Kiik | H02S 20/25 52/173.3 |

FOREIGN PATENT DOCUMENTS

| | | |
|---|---|---|
| CN | 103597696 A | 2/2014 |
| CN | 204084152 U | 1/2015 |
| CN | 204496682 U | 7/2015 |
| EP | 2043160 A2 | 4/2009 |
| EP | 2482626 A1 | 8/2012 |
| KR | 100996242 B1 | 11/2010 |
| WO | WO-2010093695 A2 | 8/2010 |
| WO | WO/2017/222966 | 12/2017 |

OTHER PUBLICATIONS

Helene Conseil, et al. "Humidity Build-up in a Typical Electronic Enclosure Exposed to Cycling Conditions and Effect an Corrosion Reliability" IEEE Transactions on Components, Packaging, and Manufacturing Technology, vol. 6, No. 9, Sep. 2016.

Vadimas Verdingovas et al., "Impact of NaCL Contamination and Climatic Conditions on the Reliability of Printed Circuit Board Assemblies," IEEE Transactions on Device and Materials Reliability, vol. 14, No. 1, Mar. 2014.

Michal Tencer and John Seaborn Moss, "Humidity Management of Outdoor Electronic Equipment: Methods, Pitfalls, and Recommendations", IEEE Transactions on Components and Packaging Technologies, vol. 25, No. 1, Mar. 2002.

* cited by examiner

HUMIDITY-CONTROLLED ELECTRONIC COMPONENT ASSEMBLIES FOR PHOTOVOLTAIC SYSTEMS

BACKGROUND

Typical photovoltaic (PV) modules may generate direct current (DC) power based on received solar energy. PV modules may include a plurality of PV or solar cells electrically coupled to one another such that the PV cells contribute to a combined output power for a PV module. A PV system or module can include an electronic component for conditioning DC power generated by the solar cells. In particular applications, the DC power generated by a PV module may be converted to alternating current (AC) power through the use of a power inverter. The power inverter may be electrically coupled to an output of the PV module as in an ACPV module.

PV modules and their associated electrical components may be deployed and operated in harsh environments. As protection, housings or enclosures, e.g. rigid metal boxes, are often used to protect the electrical components from moisture, heat, or other damaging environmental forces. An enclosure can also provide some or all electrical insulative protection necessary for the electrical component it houses. The enclosure can be employed with a coating or potting material to supplement moisture protection from the environment.

BRIEF DESCRIPTION OF THE DRAWINGS

The following drawings illustrate by way of example and not limitation. For the sake of brevity and clarity, every feature of a given structure is not always labeled in every figure in which that structure appears. Identical reference numbers do not necessarily indicate an identical structure. Rather, the same reference number may be used to indicate a similar feature or a feature with similar functionality, as may non-identical reference numbers. The figures are not drawn to scale.

DETAILED DESCRIPTION

Figure 1:
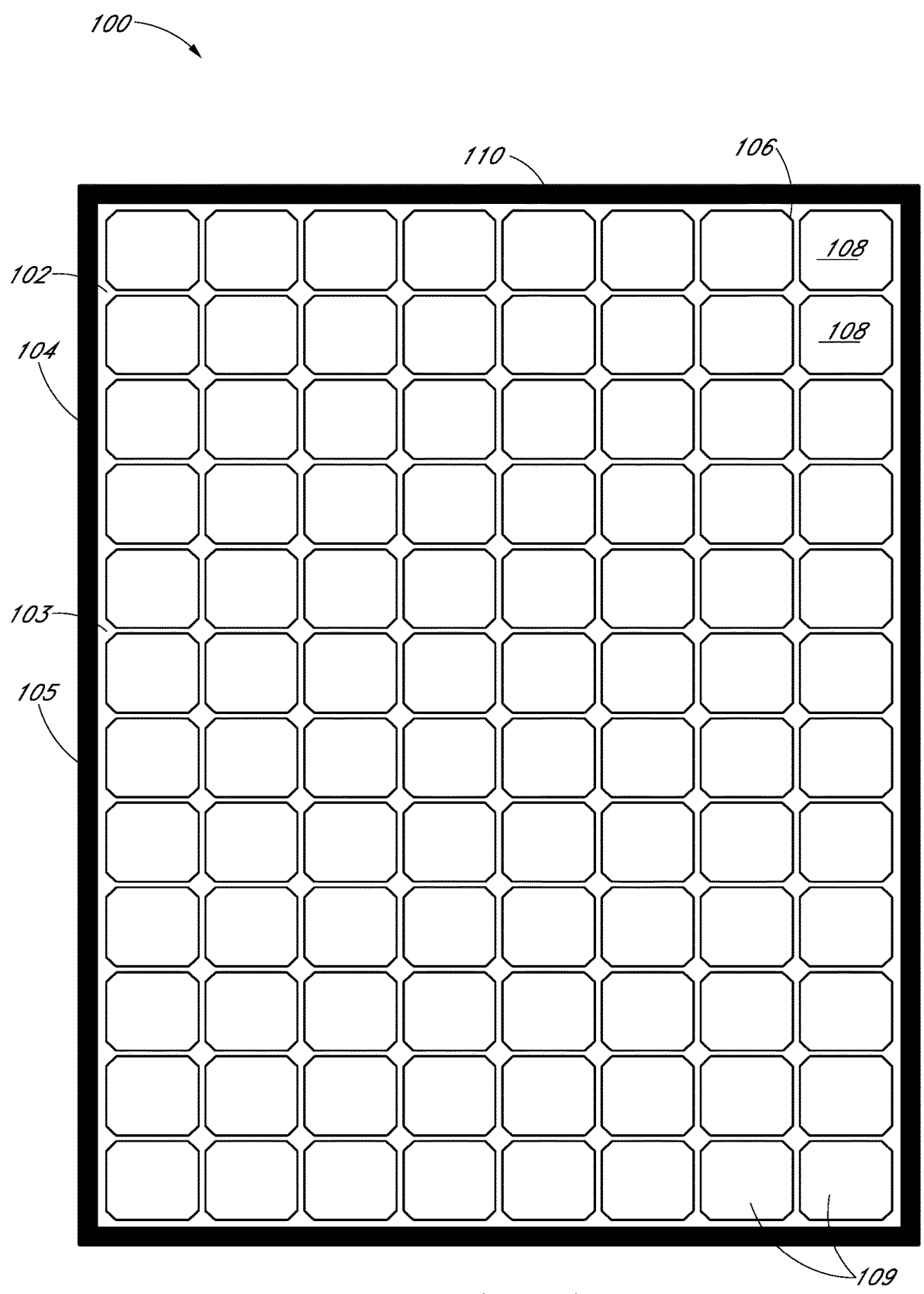
FIG. 1 depicts a front side of a photovoltaic (PV) module, in accordance with an embodiment of the present disclosure.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Certain terminology may be used in the following description for the purpose of reference only, and thus are not intended to be limiting. For example, terms such as "upper", "lower", "above", and "below" refer to directions in the drawings to which reference is made. Terms such as "front", "back", "rear", "side", "axial", and "lateral" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second", and other such numerical terms referring to structures do not imply a sequence or order unless clearly indicated by the context.

Terminology—The following paragraphs provide definitions and/or context for terms found in this disclosure (including the appended claims):

This specification includes references to "one embodiment" or "an embodiment." The appearances of the phrases "in one embodiment" or "in an embodiment" do not necessarily refer to the same embodiment. Particular features, structures, or characteristics can be combined in any suitable manner consistent with this disclosure.

This term "comprising" is open-ended. As used in the appended claims, this term does not foreclose additional structure or steps.

Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

As used herein, the terms "first," "second," etc. are used as labels for nouns that they precede, and do not imply any type of ordering (e.g., spatial, temporal, logical, etc.). For example, reference to a "first" encapsulant layer does not necessarily imply that this encapsulant layer is the first encapsulant layer in a sequence; instead the term "first" is used to differentiate this encapsulant from another encapsulant (e.g., a "second" encapsulant).

The terms "a" and "an" are defined as one or more unless this disclosure explicitly requires otherwise.

The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

As used herein, "inhibit" is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

As used herein, the term "substantially" is defined as largely but not necessarily wholly what is specified (and includes what is specified; e.g., substantially 90 degrees includes 90 degrees and substantially parallel includes parallel), as understood by a person of ordinary skill in the art. In any disclosed embodiment, the terms "substantially," "approximately," and "about" may be substituted with "within [a percentage] of" what is specified, where the percentage includes 0.1, 1, 5, and 10 percent.

As used herein, "regions" can be used to describe discrete areas, volumes, divisions or locations of an object or material having definable characteristics but not always fixed boundaries.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present invention. The feature or features of one embodiment can be applied to other embodiments, even though not described or illustrated, unless expressly prohibited by this disclosure or the nature of the embodiments.

Photovoltaic (PV) modules can include one or more electronic components for conditioning DC power generated by PV or solar cells of a PV module. The electronic components can be protected by an enclosure or housing. One of the primary causes of failure in solar electronics (e.g., microinverters, DC-DC optimizers, clipping circuits, etc.) is the ingress of atmospheric moisture into the electronic enclosure. Once inside the enclosure, moisture can condense on electronic circuitry, thereby creating short circuits and/or accelerating corrosion. Some approaches to protect electronic components from moisture damage include encapsulating the electronic circuitry with a potting material inside the enclosure. Various types of encapsulants, potting materials (pottants) or conformal coatings can be employed. For example, potting materials like polyurethanes and silicones or conformal coatings like acrylics and parylenes can be employed.

While potting materials can add significant weight and cost, they can be effective at preventing water from impacting potted electronic components. However, small voids in the potting can trap moisture and ultimately lead to corrosion or other issues. Furthermore, the potting compounds may react unfavorably with chemicals on the electronic circuitry or printed circuit board (PCB). An additional problem with using potting materials is that they can place undue mechanical stress on electrical components, ultimately resulting in fractures of solder joints or other damage.

Conformal coatings do not add significant weight and are generally more favorable to solder joints, but conformal coatings are generally higher in cost and reliable application of the conformal coating can be difficult. If the coating material is sprayed on the electronic circuitry, it can be problematic to ensure that the coating properly "underfills" larger electronic components, such as bulky capacitors or magnetic components. Poor underfilling results in gaps in the coating which can enable water condensation and ultimately lead to failure. Some coating approaches include dipping circuit boards into a conformal coating material to improve the underfilling characteristics. Conformal coatings applied in a batch dip process can be costly as an inline manufacturing process and coating inconsistencies can still be present. Conformal coatings applied via chemical vapor deposition (CVD) can generally eliminate coating gaps, however, this approach can be quite expensive and challenging as a manufacturing process.

The above coating or potting approaches can be limited in their ability to prevent water from collecting on electronic circuits associated with PV systems. A more active humidity control system and approach particularly suited for PV module-level electronics is described herein. Humidity control systems are commonly used in electronic cabinets to improve reliability. Such humidity control systems generally rely on dehumidifiers that include active pumps and fans so they are not suitable options for electronic components of a PV module e.g. a microinverter. Furthermore, conventional humidity control systems can employ relatively costly humidity sensors, the costs of which can be more easily absorbed by products like large electronic cabinets. For PV systems comprising electronic component assemblies described herein, the objective can be to prevent humidity within the electronic component assembly from exceeding a value (one that may vary based on outside temperature) that may cause condensation (e.g., a dew point) as opposed to controlling humidity to a particular value or range.

Improved PV assemblies and modules comprising humidity-controlled electronic component assemblies described herein can comprise uncoated or conformal-coated power electronics. Additionally, some PV assemblies and modules comprising humidity-controlled electronic component assemblies described herein can comprise fully or partially potted power electronics. As described above, water vapor can penetrate (albeit more slowly) potting material and eventually contact sensitive electronic circuits. In potted embodiments for example, a humidity-controlled electronic component assembly can be operated so as to periodically "dry out" potting material of an electronic component assembly.

PV assemblies and modules for converting solar radiation to electrical energy are disclosed herein. A PV module comprises a plurality of solar cells for generating DC power. In an embodiment, the plurality of solar cells are encapsulated within a PV laminate. A PV assembly comprises an electronic component assembly coupled to the PV module. The electronic component assembly comprises an enclosure defining an inner or interior region and a power conditioning circuit within the interior region of the enclosure. The power conditioning circuit comprises at least one electronic component for conditioning power generated by the plurality of solar cells. The electronic component assembly comprises a first electrical conduit for inputting direct current (DC) generated by the plurality of solar cells to the power conditioning circuit. The electronic component assembly further comprises a second electrical conduit for outputting conditioned power from the power conditioning circuit. Additionally, the electronic component assembly comprises a humidity control circuit within the enclosure for performing a dehumidification operation. The humidity control circuit comprises a first heating component and regulates a moisture or humidity level within the interior region of the enclosure.

Alternating current photovoltaic (ACPV) assemblies and modules are also described herein. An ACPV assembly or module can comprise a power inverter or DC-AC inverter, commonly referred to as a "microinverter," for converting direct current to alternating current such that the second electrical conduit outputs alternating current from the microinverter. Although many of the examples described herein are alternating current photovoltaic (ACPV) modules, the techniques and structures apply equally to other (e.g., direct current) PV modules as well.

FIG. 1 illustrates a PV module 100 comprising a PV laminate 106 having a front side 102 that faces the sun during normal operation to collect solar radiation and a back side 104 opposite the front side 102. The module 100 comprises a laminate 106 encapsulating a plurality of solar cells 108. In some embodiments, the module 100 can be 'frameless.' However, in other embodiments, module 100 comprises a support member or frame 110 surrounding the laminate 106, such as depicted in FIG. 1. In other embodiments, a support member or frame can partially surround the laminate. In some embodiments, the frame 110 can be integrally formed or formed as a unitary body. In other embodiments, the frame 110 can be formed from an assembly of parts. In an embodiment, frame 110 can comprise circumferentially extending flanges, ridges, edges or other protrusions. The frame 110 can be formed of a metal (e.g. aluminum) material, a polymeric material, or a combination thereof. The frame can be at least partially electrically conductive and in such embodiments, may need to be electrically grounded.

The solar cells 108 can face the front side 102 and be arranged into a plurality of solar cell strings 109. The laminate 106 can include one or more encapsulating layers which surround and enclose the solar cells 108. In various embodiments, the laminate 106 comprises a top cover 103 made of glass or another transparent material on the front side 102. In certain embodiments, the material chosen for construction of the cover 103 can be selected for properties which minimize reflection, thereby permitting the maximum amount of sunlight to reach the solar cells 108. The top cover 103 can provide structural rigidity to the laminate 106. The laminate 106 can further comprise a backsheet 105 on the back side 104. The backsheet 105 can be a weatherproof and electrically insulating layer which protects the underside of the laminate 106. The backsheet 105 can be a polymer sheet, and it can be laminated to encapsulant layer(s) of the laminate 106, or it can be integral with one of the layers of the encapsulant.

Figure 2:
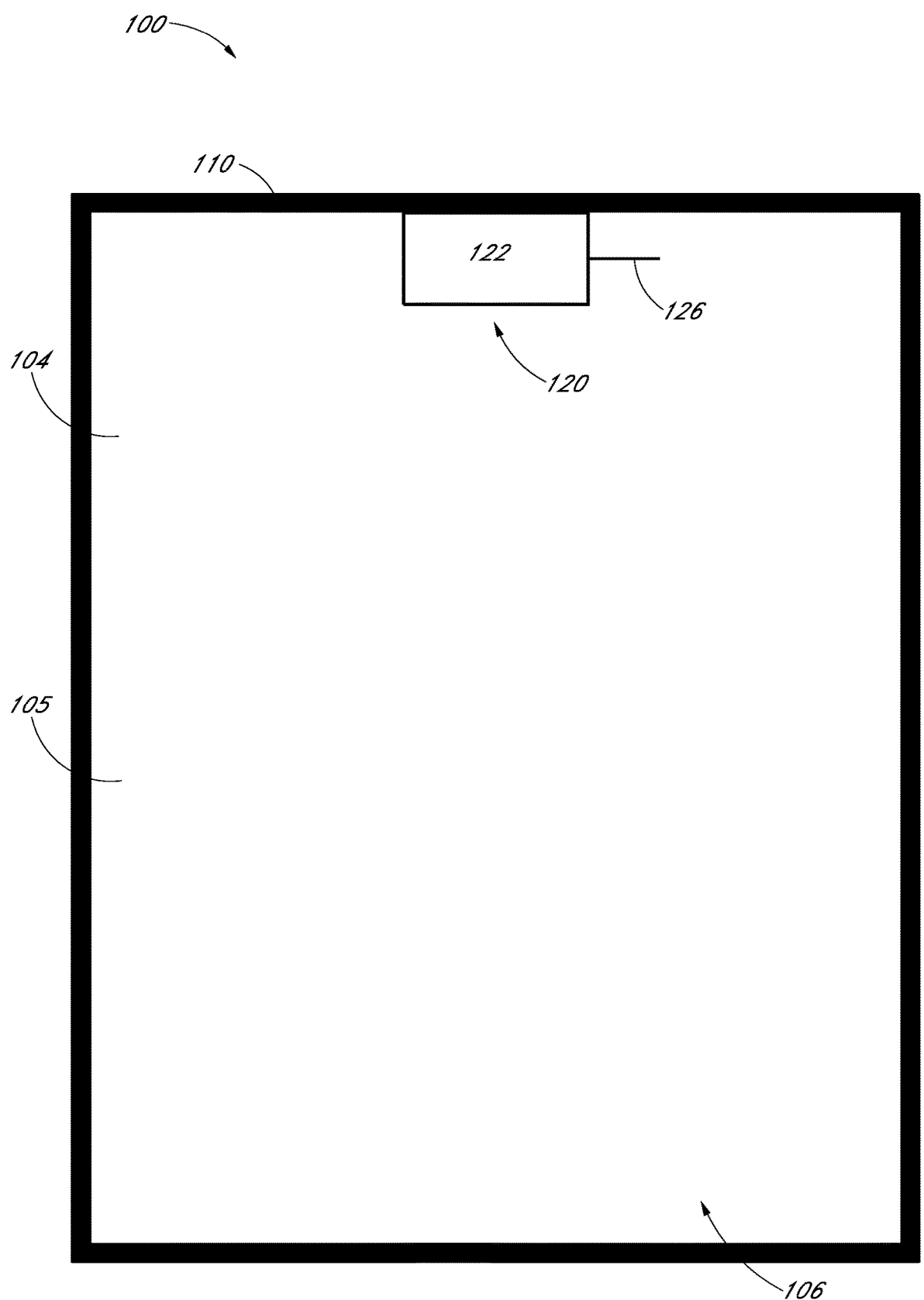
FIG. 2 depicts a back side of a PV module, in accordance with an embodiment of the present disclosure.

FIG. 2 depicts a view of the back side 104 of module 100 comprising an electronic component assembly 120 for conditioning power generated by the solar cells 108. In an embodiment, the electronic component assembly 120 can be coupled to the backsheet 105 of the laminate 106 via an adhesive or other securing device or feature. In some embodiments, the electronic component assembly 120 can be coupled or mounted to the frame 110 via screws, an adhesive or other securing device or feature. In various embodiments, the electronic component assembly 120 is removably coupled to the frame 110 of module 100. In some embodiments, the electronic component assembly 120 is mounted to the frame 110 of the module 100. The electronic component assembly 120 can comprise mating features for mechanically coupling to a corresponding mating feature of the frame 110.

In one embodiment, the electronic component assembly 120 is secured to the frame 110 of module 100 such that the electronic component assembly 120 is substantially centered between two corners of the frame 110 as depicted in FIG. 2. In other embodiments, the electronic component assembly 120 can be provided at or towards a corner of the frame 110. In some embodiments, the module 100 will not include a frame. In such embodiments, the electronic component assembly 120 can be disposed substantially at the center or at a corner of the laminate 106. The electronic component assembly can be provided at any desirable position relative to the PV laminate, whether at a center, edge, corner, side edge, corner edge, etc.

In an embodiment, the electronic component assembly 120 comprises a housing or enclosure 122. The electronic component enclosure 122 can define an interior region and seal interior electronic components from moisture, dust and other contaminants, as well as dissipate generated heat. In an embodiment, the electronic component enclosure 122 is composed of a metallic material such as aluminum. In another embodiment, the electronic component enclosure 122 is composed of a heat dissipating polymer. The electronic component enclosure 122 can be integrally formed or be formed from an assembly of parts. For example, the electronic component enclosure 122 can be provided as an assembly comprising a base portion and a cover portion.

Figure 3:
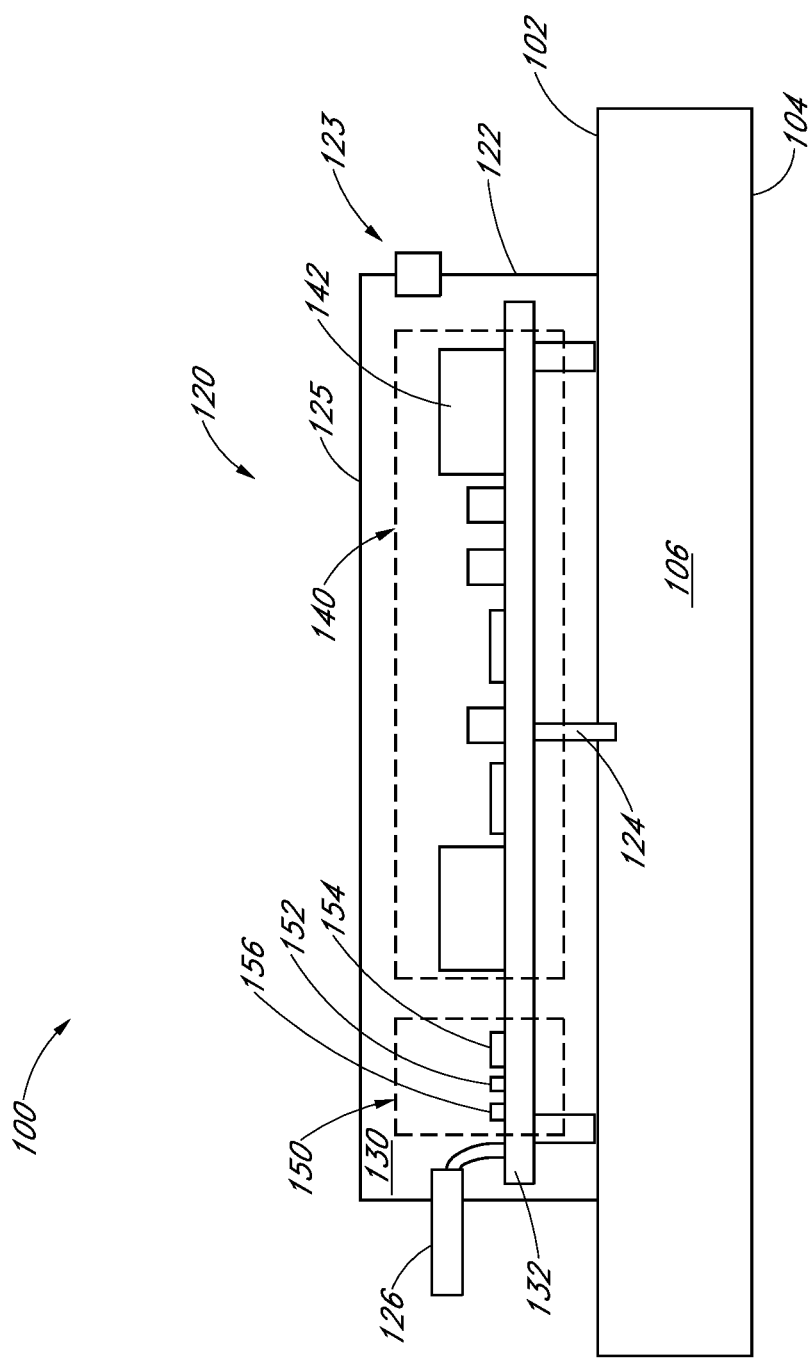
FIG. 3 depicts a side cross-sectional view of an electronic component assembly of a PV module, in accordance with an embodiment of the present disclosure.

FIG. 3 depicts a side cross-sectional view of electronic component assembly 120 coupled to PV laminate 106. In an embodiment, the electronic component assembly 120 is electrically connected to the plurality of solar cells 108 encapsulated within the laminate 106. The electronic component assembly 120 comprises a first electrical conduit 124 for inputting direct current generated by the plurality of solar cells 108 into the electronic component assembly. In one embodiment, the electronic component assembly 120 can directly connect to electrical connections protruding from the backsheet 105 of the laminate 106 through the first electrical conduit 124 in electrical connection with solar cells 108 encapsulated in PV laminate 106.

In other embodiments, the electronic component assembly 120 can be electrically connected to the plurality of solar cells 108 via a junction box (not pictured). A junction box can encapsulate electrical connections protruding from the backsheet 105 of laminate 106, wherein the protruding electrical connections are in electrical connection with the solar cells 108. A junction box can also include bypass diodes for providing alternate current pathways through the module 100 should one of the solar cells 108 and/or solar cell strings 109 of the module 100 become damaged, shaded, or otherwise inoperable. In some embodiments, the electronic component assembly 120 is configured to be removably coupled to a junction box (if present).

In an embodiment, the electronic component assembly 120 comprises a second electrical conduit 126 for outputting conditioned power. The second electrical conduit 126 outputs conditioned power to an external load and can be connected to adjacent modules to form a PV array. In several embodiments, the electronic component assembly 120 comprises a microinverter for converting direct current generated by the solar cells 108 to alternating current or AC power. In such embodiments, the module 100 can be described as an ACPV module.

As depicted in FIG. 3, the enclosure 122 defines an interior region 130 comprising a power conditioning circuit 140 and a humidity control circuit 150, each generally indicated by dashed lines. In some embodiments, the power conditioning circuit 140 and the humidity control circuit 150 are mounted on a common printed circuit board (PCB) 132 such as depicted in FIG. 3. However, in other embodiments, the power conditioning circuit 140 and the humidity control circuit 150 can be mounted on separate PCBs. In yet other embodiments, the PCB may be absent.

In an embodiment, the power conditioning circuit 140 comprises one or more electronic components for conditioning power generated by the plurality of solar cells 108 of laminate 106. The first electrical conduit 124 inputs direct current generated by the plurality of solar cells 108 of laminate 106 to the power conditioning circuit 140. In one embodiment, the power conditioning circuit 140 comprises an electronic DC to DC optimizer or converter for converting the raw power output of solar cells 108, for example to an optimized high voltage, low current output. In some embodiments, the power conditioning circuit 140 comprises a microinverter and/or related electronic components 142 for converting direct current generated by the plurality of solar cells 108 into alternating current. In such embodiments, the module 100 is an ACPV module and the second electrical conduit 126 outputs alternating current from the power conditioning circuit 140.

Figure 4:
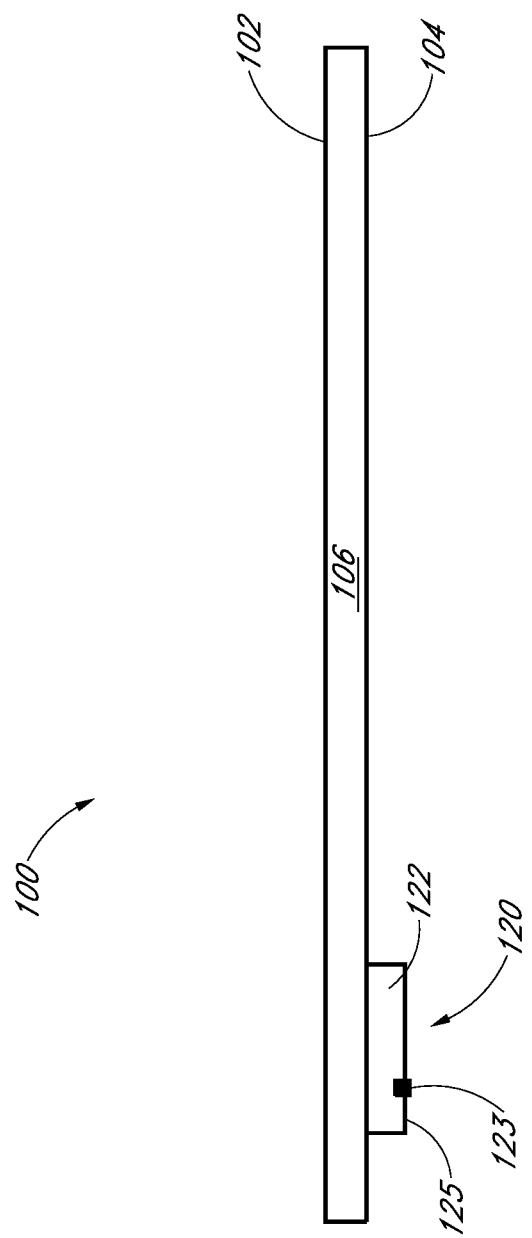
FIG. 4 depicts a side view of a PV module, in accordance with an embodiment of the present disclosure.

In an embodiment, the electronic component enclosure 122 may be sealed to inhibit moisture from entering the interior region 130 comprising the power conditioning circuit 140. Despite the enclosure 122 being sealed, fluctuations in temperature both inside and outside the enclosure 122 can create pressure differences that can drive water vapor into the interior region 130 of the enclosure 122. In some embodiments, the enclosure 122 of the electronic component assembly 120 comprises a hole or vent 123. The vent 123 can allow passage of air but prevent liquid water or debris from passing therethrough. For example, the vent can be a Gore® vent a Gore vent and can allow air pressure to equalize between the interior 130 and exterior of the enclosure 122. In some embodiments, the vent can allow water vapor to pass therethrough. In one embodiment, the enclosure 122 can comprise a hole e.g. a weep-hole to allow liquid water to drain therethrough. As depicted in FIG. 4, a weep-hole 123 can be positioned towards the underside 125 of electronic component enclosure 122 so as to facilitate drainage of water via gravity. A particular orientation of the module 100 can differ, for example depending on the particulars of an installation site. Similarly, the relative positioning of a vent or weep-hole can be altered as desired. Furthermore, it should be appreciated that the relative orientation of circuitry and components within the electronic component assembly 122 can be modified as desired.

Referring again to FIG. 3, the humidity control circuit 150 comprises one or more electrical components for performing a dehumidification operation for the interior region 130 of the enclosure 122. In one embodiment, the humidity control circuit 150 comprises a first heating component 152 that can be actuated by any desirable means. In one embodiment, the first heating component 152 of the humidity control circuit 150 can be a resistive element or resistor provided to generate heat within the interior region 130 of the enclosure 120.

In some embodiments, the first heating component 152 of the humidity control circuit 150 is also a component (e.g. a power semiconductor) of the power conditioning circuit 140 which can normally produce heat when active. For example, transistor components of the power conditioning circuit 140 can also be one or more heating components of the humidity control circuit 150. It may be appreciated that a higher rate of water condensation within the enclosure 122 can occur at night when the sun is not out and the ambient temperature is lower. In embodiments where the first heating component 152 of the humidity control circuit 150 is also a component of the power conditioning circuit 140, the power conditioning circuit 140 can be substantially inactive at night and thus heating component(s) of the power conditioning circuit 140 can be available to act as heating element(s) of the humidity control circuit 150.

The humidity control circuit 150 can be powered by any desirable power source. In one embodiment, the humidity control circuit 150 is powered by direct current from the first electrical conduit 124. In another embodiment, the humidity control circuit 150 is powered by AC power from the second electrical conduit 126, wherein the AC power can be received directly from the power conditioning circuit 140 and/or an external power source or grid. In yet another embodiment, the humidity control circuit 150 can be powered by an "on-board" power source e.g. a battery.

In some embodiments, the humidity control circuit 150 further comprises a humidity sensing component or sensor 154 for sensing a moisture or humidity level within the interior region 130 of the enclosure 122. For example, a humidity sensor 154 can output an electrical parameter as a function of moisture content within enclosure 122. In one embodiment, the sensor 154 is a temperature sensor, for example outputting the wet-bulb temperature or dew point temperature within enclosure 122. In one embodiment, sensor 154 is a wire filament being comprised of an electrically conductive material (e.g. semi-conducting ceramic) having an electrical resistance which varies as a function of humidity and/or temperature. As depicted in FIG. 3, the sensor 154 is located within enclosure 122, however in other embodiments, a sensor can be located outside of the enclosure 122 so as to monitor ambient environmental conditions. In some embodiments, the humidity control circuit 150 can receive a signal based on a humidity level of the ambient environment external to the enclosure 122 as will be described in more detail below.

In various embodiments, the humidity control circuit 150 regulates a humidity level of the interior region 130 of the enclosure 122. In one embodiment, the humidity level can be controlled "passively", for example the first heating component 152 can be a component of the power conditioning circuit 140, and thereby being actuated based on an operating state of the power conditioning circuit 140. In other embodiments, the humidity level can be controlled in a more active manner. For example, the PV module 100 can comprise a control unit 156 for regulating the humidity level within the interior region 130 of the enclosure 122. As depicted in FIG. 3, the control unit 156 is a component of the humidity control circuit 150 located within the enclosure 122. However, in other embodiments, the control unit can be located outside of the enclosure 122.

In an embodiment, the control unit 156 is configured to actuate the first heating component 152 if a measured humidity level within the interior region 130 is above a predetermined maximum humidity level. For example, if the measured humidity level within the interior region 130 is above a predetermined maximum relative humidity level of 50% RH (Relative Humidity), then the control unit 156 actuates the first heating component 152. As an example, deposits, films or monolayers of moisture or condensation may form below a particular condensation humidity level e.g. 70% RH. Therefore, the predetermined maximum relative humidity level can be selected below the condensation humidity level with a margin of protection e.g. 50% RH. As another example, the dew point of the ambient environment or within the enclosure 122 can be measure or estimated and the control unit 156 can be configured to actuate the first heating component 152 if a sensed or measured temperature reaches a predetermined threshold e.g. 10° C. above the measured or estimated dew point.

In some embodiments, the control unit 156 can comprise a communication component for receiving a signal based on a humidity level of the ambient environment external to the enclosure 122, for example the signal can comprise an encoded ambient humidity, an ambient temperature, and/or a future weather condition. In another embodiment, the humidity control circuit 150 can comprise a timer circuit for actuating the first heating component 152 after a predetermined time has lapsed, for example during night hours of a 24-hour day.

Figure 5:
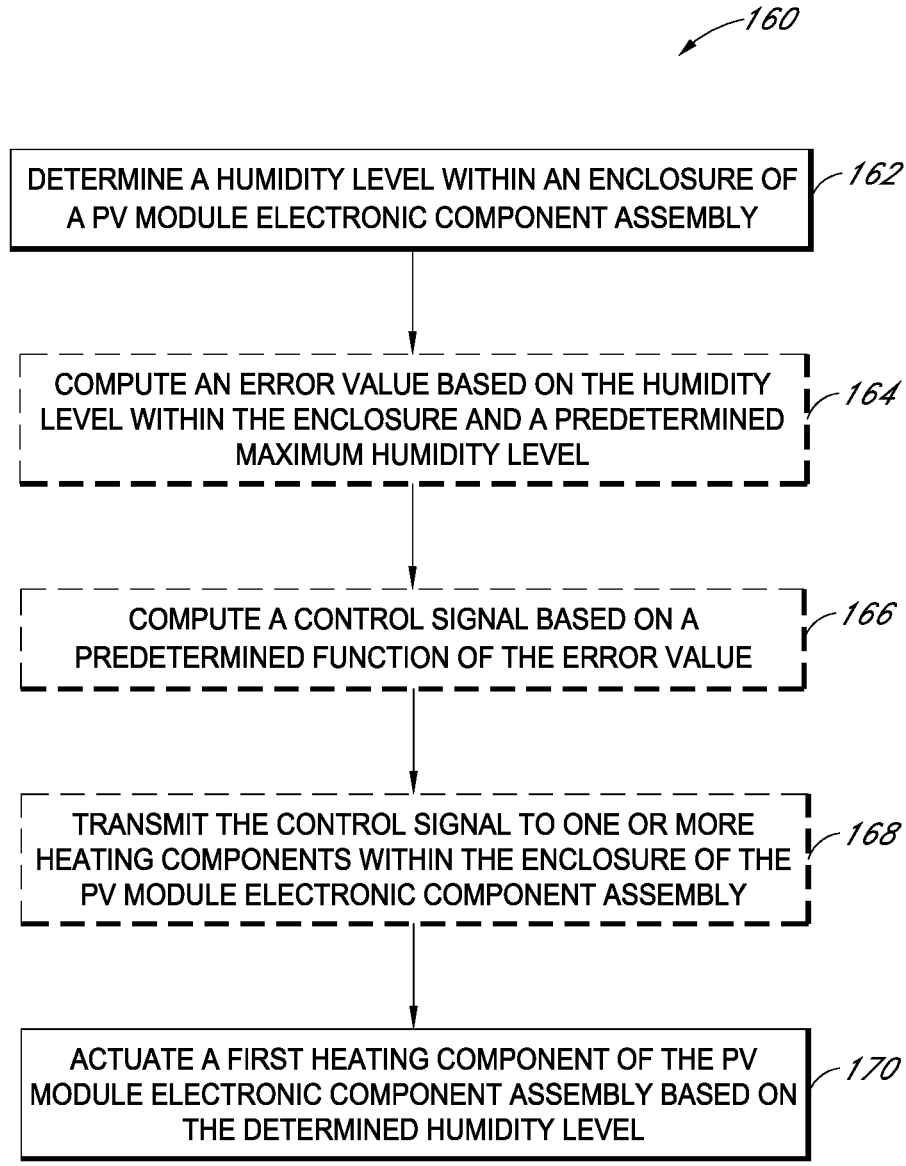
FIG. 5 depicts a flowchart listing operations in a method for regulating a humidity level within an electronic component assembly, in accordance with an embodiment of the present disclosure.
Figure 6:
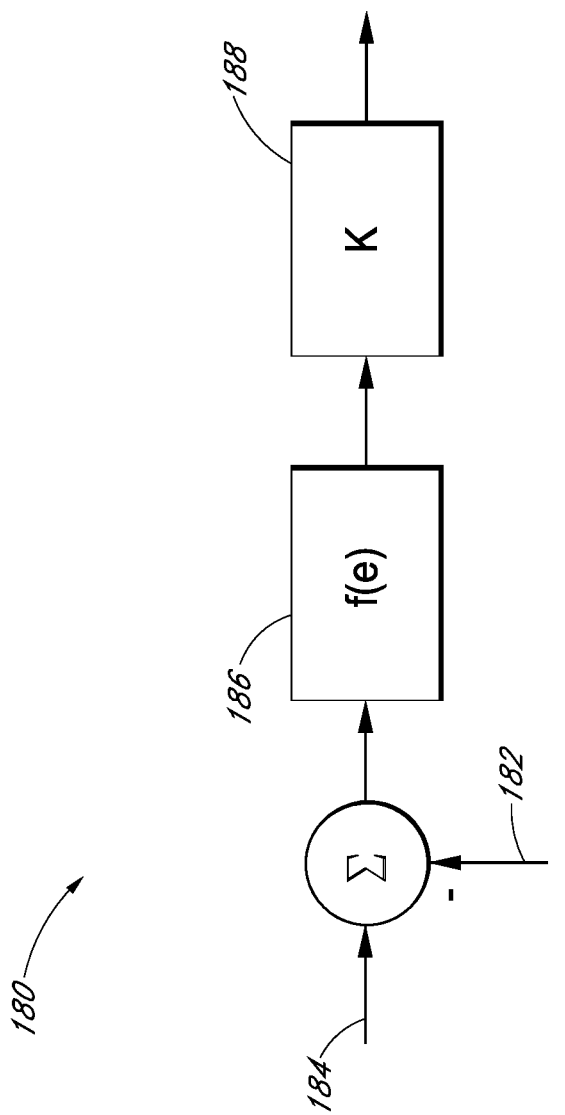
FIG. 6 depicts a control scheme for regulating a humidity level within an electronic component assembly, in accordance with an embodiment of the present disclosure.

Methods for regulating a humidity level within an enclosure of an electronic component assembly of a PV module are also described herein. FIG. 5 depicts a flowchart 160 listing operations in a method for regulating a humidity level within enclosure 122 of electronic component assembly 120. Optional operations of flowchart 160 are indicated by dashed lines. FIG. 6 depicts a control scheme 180 for regulating a humidity level within enclosure 122 of electronic component assembly 120. Referring to operation 162 of flowchart 160, a method of regulating a humidity level within an electronic component enclosure of a PV module comprises determining a humidity level 182 within the enclosure 122 of a PV module electronic component assembly 120. In one embodiment, determining the humidity level 182 within the enclosure 122 comprises sensing the humidity level of the interior region 130 of the enclosure 122, for example by sensor 154 of humidity control circuit 150. In other embodiments, determining the humidity level 182 within the enclosure 122 comprises estimating the humidity level within the enclosure 122 using present and/or future weather data e.g. ambient relative humidity or temperature.

Referring to operation 164 of flowchart 160 and to corresponding FIG. 6, a method of regulating a humidity level within an electronic component enclosure of a PV module can optionally comprise computing an error value 186 from humidity level 182 and a predetermined maximum humidity level 184. In one embodiment, the control unit 156 calculates the difference between the humidity level 182 and the predetermined maximum humidity level 184 to produce a subtraction error value 186.

Referring to optional operation 166 of flowchart 160 and to corresponding FIG. 6, a method of regulating a humidity level within electronic component 120 of PV module 100 can further comprise computing a control signal 188 based on a predetermined function f(e) of the error value 186. In an embodiment, the predetermined function f(e) of the error value 186 produces a control signal 188 indicative of how much actuation is applied to one or more heating components of the humidity control circuit 150. In an embodiment, computing the control signal 188 comprises computing the control signal by a predetermined proportional control function, integral control function, derivative control function or a combination thereof. In some embodiments, a constant K can be used to scale the predetermined function f(e). For example, constant K can scale control signal 188 to a voltage that can be applied to one or more heating components (e.g. one or more resistors). The humidity control circuit 150 can compute control signal 188 via any desirable function. Furthermore, the humidity control circuit 150 can comprise any desirable type or number of electronic components, for example switches, resistors, capacitors, amplifiers, microprocessors or other digital computers. In one embodiment, the humidity control circuit 150 includes switches such that when control signal 188 is a high logic level, one or more heating components of the humidity control circuit 150 is activated, and vice versa.

Referring to operation 168 of flowchart 160, a method of regulating a humidity level within electronic component enclosure 120 of PV module 100 can comprise transmitting the control signal to one or more heating components within the enclosure 122 of the PV module electronic component assembly 120. In one embodiment, the control unit 156 transmits the control signal 188 to the first heating component 152, thereby actuating the first heating component 152. In other embodiments, a control unit external to the electronic component assembly 120 can wirelessly transmit the control signal 188 to the humidity control circuit 150, thereby actuating the first heating component 152.

In another embodiment, two or more heating components may be alternately or differently actuated, so as to produce deliberate temperature gradients within an electronic component assembly. For example, a single heating component can produce localized heat that can reduce condensation in its physical vicinity, but allow condensation in other areas of the interior region 130 of the enclosure 122. Furthermore, localized temperature differences of air within the interior region 130 of enclosure 122 can cause localized pressure differences, which in turn can cause air flow. In one embodiment, this air flow can serve to heat areas comprising denser water vapor and help inhibit localized condensation.

FIG. 1-6 illustrate various embodiments of PV assemblies comprising electronic component assemblies and operating methods thereof. Unless otherwise specified below, the numerical indicators used to refer to components in the FIG. 7-8 are similar to those used to refer to components or features in FIG. 1-6 above, except that the index has been incremented by 100.

Figure 7A:
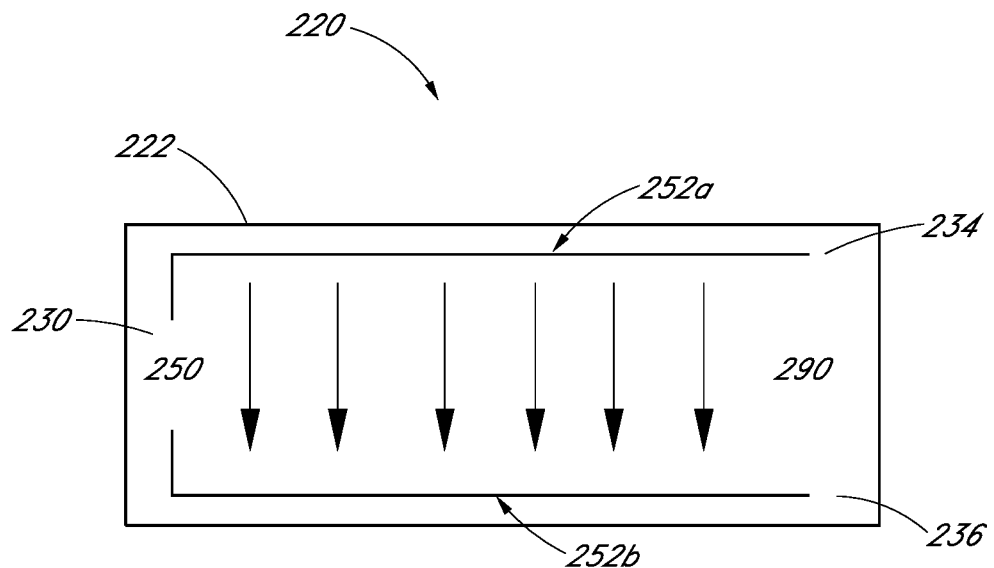
FIGS. 7A and 7B depict an interior region of an electronic component assembly, in accordance with an embodiment of the present disclosure.
Figure 7B:
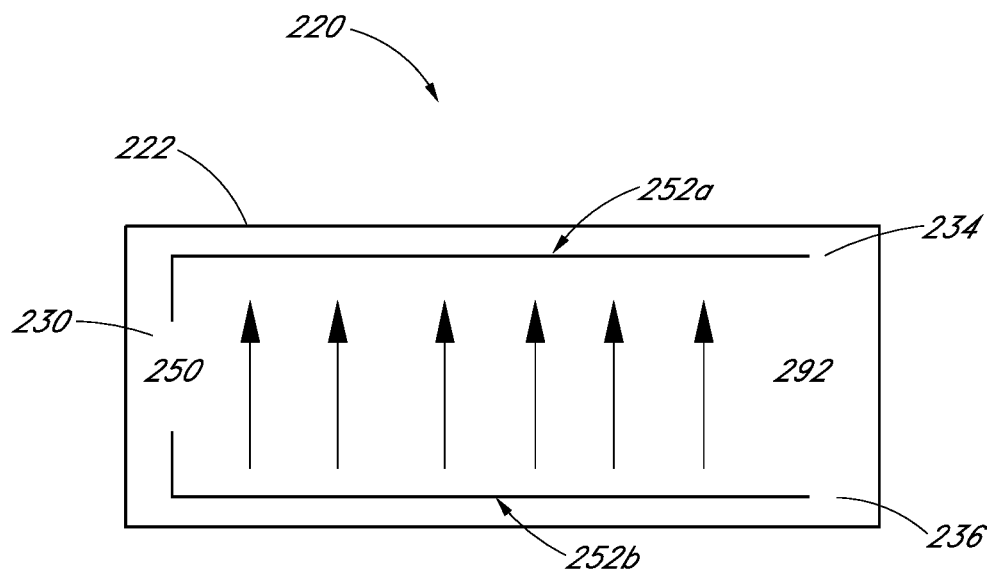

FIGS. 7A and 7B depict interior region 230 defined by enclosure 222 of electronic component assembly 220. The electronic component assembly 220 comprises a humidity control circuit 250 including a first heating component 252a and a second heating component 252b. In an embodiment, the first and second heating components 252a, 252b are configured to be actuated independently. In the example depicted in FIGS. 7A and 7B, the first and second heating components 252a, 252b are used to alternately heat different sides of the interior region 230 of enclosure 222. In some embodiments, heating components 252a, 252b can be distributed within interior region 230 such that particular areas prone to water uptake receive a focused application of heat. For example, one or more heating components can be provided near one or more regions of the power conditioning circuit that is difficult to coat or underfill.

Figure 8:
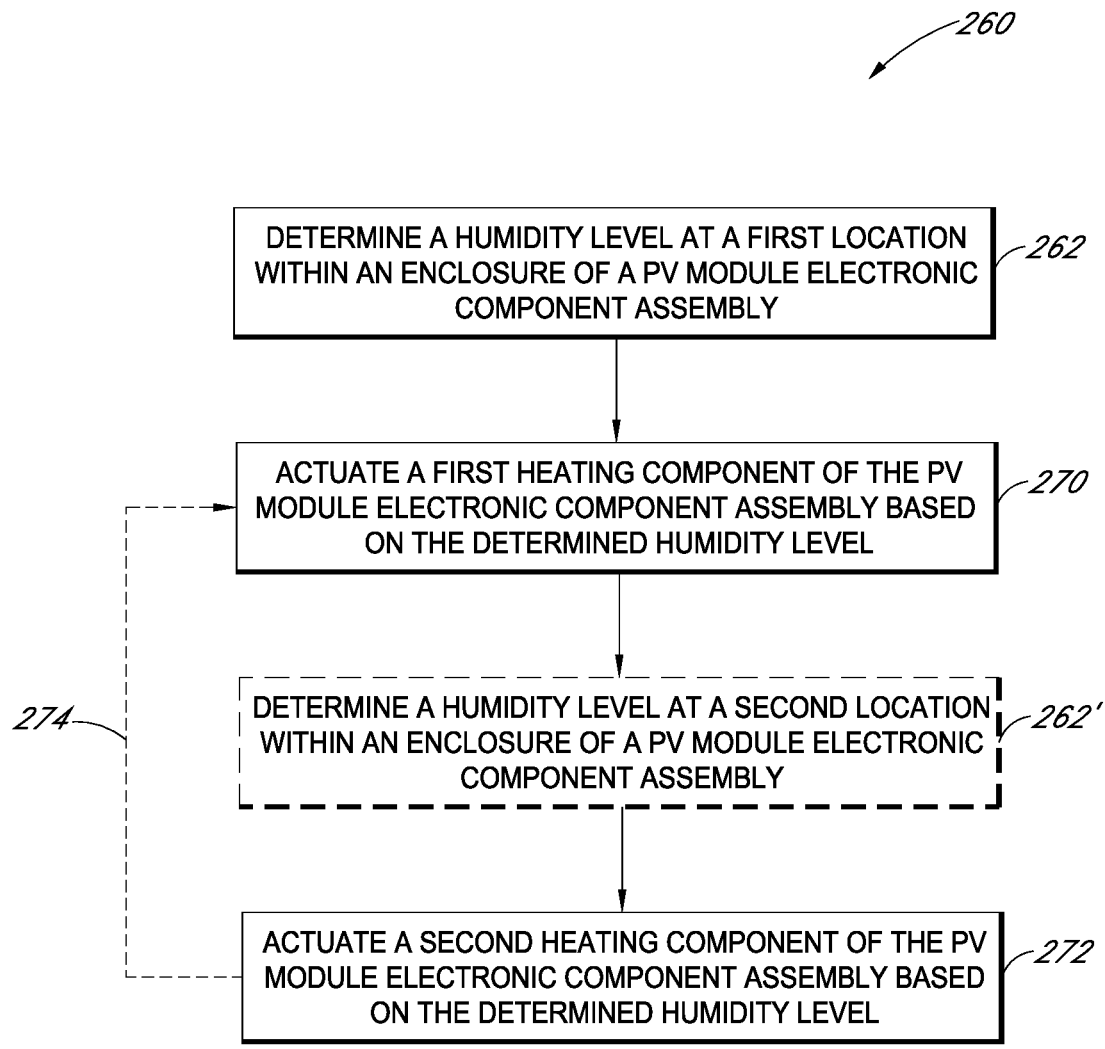
FIG. 8 depicts a flowchart listing operations in a method for regulating a humidity level within an electronic component assembly.

FIG. 8 depicts a flowchart 260 listing operations in a method for regulating a humidity level within enclosure 222 of electronic component assembly 220. Optional operations of flowchart 260 are indicated by dashed lines. At operation 262, a method of regulating a humidity level within an electronic component enclosure of a PV module comprises determining a humidity level within the enclosure 222 at a first location or sub-region 234 within the interior region 230 of the enclosure 222. In one embodiment, the first sub-region 234 is near the first heating component 252a as depicted in FIG. 7A-7B. However, in other embodiments, the first sub-region 234 at which a humidity level is determined can be located near areas prone to water uptake, for example near electronic components having large underfill gaps or near vents.

Referring to operation 270 of flowchart 260 and to corresponding FIG. 7A, a method of regulating a humidity level within an electronic component enclosure of a PV module comprises actuating the first heating component 252a of the PV module electronic component assembly 220 based on the determined humidity level at the first sub-region 234 within the interior region 230. In an embodiment, actuation of the first heating component 252a forces air within the enclosure 222 to move in a first direction 290.

Referring to operation 272 of flowchart 260 and to corresponding FIG. 7B, a method of regulating a humidity level within an electronic component enclosure of a PV module further comprises actuating the second heating component 252b. In an embodiment, actuation of the second heating component 252b can force air within the enclosure 222 to move in a second direction 292. In an embodiment, the first direction 290 is substantially opposite the second direction 292, such as depicted in FIGS. 7A and 7B. However, in other embodiments, air flow pathways can be produced in any desirable direction, for example the first and second directions 290, 292 can be substantially perpendicular. Not to be bound by any particular theory, but the alternate actuation of the first and second heating components 252a, 252b can cause air to move back and forth between first and second sub-regions within the interior region 230 of enclosure 222.

In various embodiments, the first and second heating components 252a, 252b can be alternately actuated in a continuous manner as indicated at 274 of flowchart 260. In one embodiment a control signal is alternately applied to the first and second heating components 252a, 252b with a predetermined periodicity. The period of the alternation can be varied or fixed as desired to optimize humidity regulation throughout the interior region 230 of enclosure 222.

In some embodiments, actuating the second heating component 252b at 272 can be based on the determined humidity level at the first sub-region 234 within the interior region 230. However, in other embodiments, actuating the second heating component 252b at 272 can be based on a determined humidity level at a second sub-region 236 within the interior region 230. At optional operation 262', a method of regulating a humidity level within a PV module electronic component enclosure can further comprise determining a humidity level within the enclosure 222 at second sub-region 236 within interior region 230 of enclosure 222. In yet other embodiment, actuation of the first heating component 252a and/or second heating component 252b can be based on an ambient humidity level exterior to the enclosure 222 (either actual or estimated).

Any desirable number of heating components in any desirable configuration can be provided in interior region 230 to regulate the humidity within electronic component assembly 220. Furthermore, any desirable number of sensors in any desirable configuration can be provided in the interior region 230 to determine or estimate the moisture or humidity level at one or more locations or sub-regions within the enclosure 222. In one embodiment, humidity level outputs from a plurality of sensors may be aggregated (e.g. by averaging or using a weighted sum) to provide an overall representation of humidity within enclosure 222. In another embodiment, each of a plurality of sensors can be associated with one of a plurality of humidity control circuits such that the humidity within the interior region 230 is regulated by a plurality of localized humidity control circuits.

In some embodiments, a humidity level within enclosure can be indirectly measured or estimated. For example, internal temperature within the interior region of the electronic component assembly can be monitored or sensed on a continuous basis. This internal temperature information can be combined with ambient weather conditions (directly measured or received from a weather data service provider) to infer a dew point and therefore a minimum temperature that the interior region of the electronic component assembly should reach. In other words, the humidity control circuit can utilize a temperature control approach, in response to humidity inferences. In an embodiment, a humidity control unit can obtain ambient weather conditions by receiving communication signals either wirelessly or through a wired connection (e.g. from a central gateway unit associated with a PV array). For example, a central gateway can provide weather information (e.g. accessed via the Internet) so as to provide minimum temperature thresholds for the interior region of the electronic component assembly.

The above specification and examples provide a complete description of the structure and use of illustrative embodiments. Although certain embodiments have been described above with a certain degree of particularity, or with reference to one or more individual embodiments, those skilled in the art could make numerous alterations to the disclosed embodiments without departing from the scope of this invention. As such, the various illustrative embodiments of the methods and systems are not intended to be limited to the particular forms disclosed. Rather, they include all modifications and alternatives falling within the scope of the claims, and embodiments other than the one shown can include some or all of the features of the depicted embodiment. For example, elements can be omitted or combined as a unitary structure, and/or connections can be substituted. Further, where appropriate, aspects of any of the examples described above can be combined with aspects of any of the other examples described to form further examples having comparable or different properties and/or functions, and addressing the same or different problems. Similarly, it will be understood that the benefits and advantages described above can relate to one embodiment or can relate to several embodiments. For example, embodiments of the present methods and systems can be practiced and/or implemented using different structural configurations, materials, and/or control manufacturing steps. The claims are not intended to include, and should not be interpreted to include, means-plus- or step-plus-function limitations, unless such a limitation is explicitly recited in a given claim using the phrase (s) "means for" or "step for," respectively.

The invention claimed is:

1. An alternating current photovoltaic (ACPV) module comprising:
    a photovoltaic (PV) laminate having a front side that faces the sun during normal operation to collect solar radiation during normal operation of the ACPV module and a back side opposite the front side, the PV laminate comprising:
        a plurality of solar cells disposed within the PV laminate; the plurality of solar cells arranged into a plurality of solar cell strings; and,
        a backsheet on the back side of the PV laminate;
    a frame surrounding the PV laminate;
    an electronic component assembly coupled to the frame, the electronic component assembly comprising:
        an enclosure defining an interior region;
        a power conditioning circuit within the interior region of the enclosure, the power conditioning circuit comprising a microinverter for converting direct current generated by the plurality of solar cells into alternating current;
        a first electrical conduit for inputting direct current generated by the plurality of solar cells to the power conditioning circuit;

a second electrical conduit for outputting alternating current from the power conditioning circuit;
a humidity control circuit within the enclosure for performing a dehumidification operation, the humidity control circuit comprising:
a first heating component;
a humidity sensing component; and,
wherein the humidity control circuit regulates a humidity level within the interior region of the enclosure by applying an amount of actuation, of a plurality of amounts of actuation, to the first heating component to activate the first heating component.

2. The PV assembly according to claim 1, wherein the first heating component of the humidity control circuit comprises a resistor.

3. The PV assembly according to claim 1, wherein the first heating component of the humidity control circuit is a component of the power conditioning circuit that is utilized in performing power conditioning by the power conditioning circuit.

4. A photovoltaic (PV) assembly comprising:
a PV module comprising a plurality of solar cells;
an electronic component assembly coupled to the PV module, the electronic component assembly comprising:
an enclosure defining an interior region;
a power conditioning circuit within the interior region of the enclosure, the power conditioning circuit comprising an electronic component for conditioning power generated by the plurality of solar cells;
a first electrical conduit for inputting direct current generated by the plurality of solar cells to the power conditioning circuit;
a second electrical conduit for outputting conditioned power from the power conditioning circuit;
a humidity control circuit within the enclosure for performing a dehumidification operation, the humidity control circuit comprising a first heating component;
wherein the humidity control circuit regulates a humidity level within the interior region of the enclosure by applying an amount of actuation, of a plurality of amounts of actuation, to the first heating component.

5. The PV assembly according to claim 4, wherein the humidity control circuit regulates the humidity level within the interior region of the enclosure based on a humidity level of the ambient environment external to the enclosure.

6. The PV assembly according to claim 4, wherein the power conditioning circuit comprises a microinverter for converting direct current generated by the plurality of solar cells into alternating current and wherein the second electrical conduit outputs alternating current from the microinverter.

7. The PV assembly according to claim 4, wherein the power conditioning circuit comprises an electronic DC to DC optimizer.

8. The PV assembly according to claim 4, wherein the humidity control circuit comprises a sensor.

9. The PV assembly according to claim 8, wherein the sensor is a temperature sensor.

10. The PV assembly according to claim 8, wherein the sensor is a humidity sensor.

11. The PV assembly according to claim 4, wherein the PV assembly further comprises a control unit for regulating the humidity level within the interior region of the enclosure.

12. The PV assembly according to claim 11, wherein the control unit is a component of the humidity control circuit located within the enclosure.

13. The PV assembly according to claim 11, wherein the control unit is configured to actuate the first heating component if a measured humidity level within the interior region is above a predetermined maximum humidity level.

14. The PV assembly according to claim 11, wherein the control unit is configured to:
compute an error value based on a sensed humidity level and a predetermined maximum humidity level;
compute a control signal based on a predetermined function of the error value; and,
transmit the control signal to the first heating component, thereby actuating the first heating component.

15. The PV assembly according to claim 14, wherein computing the control signal comprises computing the control signal by a predetermined proportional control function, integral control function, a derivative control function or a combination thereof.

16. The PV assembly according to claim 4, wherein the humidity control circuit further comprises a second heating component; and, wherein the first and second heating components are configured to be actuated independently, and wherein actuating the first heating component causes air within the enclosure to move in a first direction, actuating the second heating component causes air within the enclosure to move in a second direction, and the first and second directions are different from one another.

17. An electronic component assembly for coupling to a PV module, the electronic component assembly comprising:
an enclosure defining an interior region;
a power conditioning circuit within the interior region of the enclosure, the power conditioning circuit comprising an electronic component for conditioning power generated by the plurality of solar cells;
a first electrical conduit for inputting direct current generated by a plurality of solar cells to the power conditioning circuit;
a second electrical conduit for outputting conditioned power from the power conditioning circuit;
a humidity control circuit within the enclosure for performing a dehumidification operation, the humidity control circuit comprising a first heating component;
wherein the humidity control circuit regulates a humidity level within the interior region of the enclosure by applying an amount of actuation, of a plurality of amounts of actuation, to the first heating component.

18. The electronic component assembly according to claim 17, wherein the humidity control circuit and the power conditioning circuit are mounted on a first printed circuit board.

19. The PV assembly according to claim 17, wherein the enclosure comprises a vent.

20. The PV assembly according to claim 17, wherein the humidity control circuit is powered via the second electrical conduit.

* * * * *